United States Patent
Yi et al.

(10) Patent No.: US 11,587,838 B2
(45) Date of Patent: Feb. 21, 2023

(54) GRINDING CONTROL METHOD AND DEVICE FOR WAFER, AND GRINDING DEVICE

(71) Applicant: Wuhan Xinxin Semiconductor Manufacturing Co., Ltd., Hubei (CN)

(72) Inventors: Hongsheng Yi, Hubei (CN); Zhijun Zhang, Hubei (CN); Yifan Yang, Hubei (CN)

(73) Assignee: Wuhan Xinxin Semiconductor Manufacturing Co., Ltd., Hubei (CN)

(*) Notice: Subject to any disclaimer, the term of this patent is extended or adjusted under 35 U.S.C. 154(b) by 681 days.

(21) Appl. No.: 16/584,425

(22) Filed: Sep. 26, 2019

(65) Prior Publication Data
US 2021/0035872 A1    Feb. 4, 2021

(30) Foreign Application Priority Data
Jul. 29, 2019    (CN) .......................... 201910690427.1

(51) Int. Cl.
*H01L 21/00* (2006.01)
*H01L 21/66* (2006.01)
*H01L 21/02* (2006.01)

(52) U.S. Cl.
CPC ........ *H01L 22/20* (2013.01); *H01L 21/02013* (2013.01)

(58) Field of Classification Search
CPC .......................... H01L 22/20; H01L 21/02013
See application file for complete search history.

(56) References Cited

U.S. PATENT DOCUMENTS

| 7,004,814 B2 | 2/2006 | Chen et al. |
| 9,102,033 B2 | 8/2015 | Hui et al. |
| 2005/0208876 A1* | 9/2005 | Chen .................. B24B 49/00 451/5 |

FOREIGN PATENT DOCUMENTS

| CN | 1670925 A | 9/2005 |
| CN | 101992422 A | 3/2011 |
| CN | 103170906 A | 6/2013 |
| CN | 105500184 A | 4/2016 |
| CN | 107984374 A | 5/2018 |
| CN | 107984375 A | 5/2018 |
| CN | 109108810 A | 1/2019 |

OTHER PUBLICATIONS

First Chinese Office Action regarding Application No. 201910690427.1 dated Mar. 17, 2020. English translation provided by Unitalen Attorneys at Law.

* cited by examiner

*Primary Examiner* — Richard A Booth
(74) *Attorney, Agent, or Firm* — Harness, Dickey & Pierce, P.L.C.

(57) ABSTRACT

A grinding control method and device for a wafer, and a grinding device are provided. A grinder is controlled to grind a mass production wafer with a set grinding parameter. In a case that it is determined to perform a test using a test wafer, the grinder may be controlled to grind the test wafer with the set grinding parameter. A first total thickness variation of the grinded test wafer is acquired by a dedicated measurement device, and an updated grinding parameter is acquired based on the first total thickness variation. The grinder is controlled to grind the mass production wafer with the updated grinding parameter. In this way, a wafer with a uniform thickness can be obtained, thereby improving flatness of the grinded wafer.

17 Claims, 9 Drawing Sheets

GRINDING CONTROL METHOD AND DEVICE FOR WAFER, AND GRINDING DEVICE

The present application claims priority to Chinese Patent Application No. 201910690427.1, titled "GRINDING CONTROL METHOD AND DEVICE FOR WAFER, AND GRINDING DEVICE", filed on Jul. 29, 2019 with the Chinese Patent Office, which is incorporated herein by reference in its entirety.

FIELD

The present disclosure relates to the technical field of semiconductor devices and methods for manufacturing the same, and in particular to a grinding control method and device for a wafer, and a grinding device.

BACKGROUND

A wafer is used as a substrate for device processing. After a device processing process is performed on a front surface of the wafer, it is required to thin the wafer at a back surface of the wafer, to facilitate other processes on the back surface of the wafer.

In a typical application, after the device processing process is performed, different wafers are stacked and bonded together with a wafer-level packaging technology, and then a thinning process is performed at a back surface of each of the wafers to remove the wafer by a thickness of more than 90% of a total thickness of the wafer. The wafer may be thinned quickly by using a grinder. However, an error in flatness of the grinded wafer is large due to limitation of a conventional grinding device in operating mode and processing precision, failing to obtain a surface with a required flatness.

SUMMARY

In view of this, a grinding control method and device for a wafer, and a grinding device are provided according to the present disclosure, to improve flatness of a grinded wafer.

A grinding control method for a wafer is provided according to an embodiment of the present disclosure, which includes:

controlling a grinder to grind a mass production wafer with a set grinding parameter;

determining whether to perform a test using a test wafer;

controlling the grinder to grind the test wafer with the set grinding parameter in a case that it is determined to perform a test using the test wafer; and acquiring an updated grinding parameter, and updating the set grinding parameter to be the updated grinding parameter, and controlling the grinder to grind the mass production wafer with the updated grinding parameter, where the updated grinding parameter is determined based on a first total thickness variation of the grinded test wafer, and the first total thickness variation of the grinded test wafer is acquired by a dedicated measurement device.

In an embodiment, the determining whether to perform the test using the test wafer comprises:

determining whether the number of the mass production wafer reaches a mass production cycle; and determining to perform a test using the test wafer in a case that the number of the mass production wafer reaches the mass production cycle.

In an embodiment, the grinder is provided with a thickness measurement device. After the controlling the grinder to grind the mass production wafer with the set grinding parameter, the method further includes: acquiring, by the thickness measurement device, a second total thickness variation of the grinded mass production wafer. The determining whether to perform the test using the test wafer comprises:

determining, based on the second total thickness variation of the grinded mass production wafer, whether to perform the test using the test wafer.

In an embodiment, the determining, based on the second total thickness variation of the grinded mass production wafer, whether to perform the test using the test wafer includes: determining whether to perform the test using the test wafer based on an offset of the second total thickness variation of the grinded mass production wafer relative to a preset thickness variation.

In an embodiment, the determining, based on the second total thickness variation of the grinded mass production wafer, whether to perform the test using the test wafer includes: determining whether to perform the test using the test wafer based on a condition that the second total thickness variation of the grinded mass production wafer is within a threshold range of a preset thickness variation.

In an embodiment, a supporting stage of the grinder is provided with a first fixed component, a second adjustable component and a third adjustable component. The updated grinding parameter includes displacement parameters of the second adjustable component and the third adjustable component.

In an embodiment, the updated grinding parameter is determined in the following way: determining, based on experimental data that is acquired in advance, the updated grinding parameter by using the first total thickness variation of the grinded test wafer. The experimental data includes a correspondence between the first total thickness variation of the grinded test wafer that is acquired by the dedicated measurement device and the updated grinding parameter.

A grinding control device for a wafer is further provided according to an embodiment of the present disclosure. The grinding control device includes a first control unit, a second control unit and a parameter updating unit. The first control unit is configured to control a grinder to grind a mass production wafer with a set grinding parameter. The second control unit is configured to control the grinder to grind a test wafer with the set grinding parameter in a case that it is determined to perform a test using the test wafer. The parameter updating unit is configured to acquire an updated grinding parameter, and update the set grinding parameter to be the updated grinding parameter. The updated grinding parameter is determined based on a first total thickness variation of the grinded test wafer, and the first total thickness variation of the grinded test wafer is acquired by a dedicated measurement device.

In an embodiment, the grinding control device further includes a determining unit. The determining unit is configured to determine whether the number of the mass production wafer reaches a mass production cycle, and determine to perform the test using the test wafer in a case that the number of the mass production wafer reaches the mass production cycle.

In an embodiment, the grinder is provided with a thickness measurement device. The grinding control device further includes a thickness information acquiring unit and a determining unit. The thickness information acquiring unit is configured to acquire, by the thickness measurement device, a second total thickness variation of the grinded mass production wafer. The determining unit is configured to determine, based on the second total thickness variation of the mass production wafer, whether to perform the test using the test wafer.

In an embodiment, the determining unit is further configured to determine whether to perform the test using the test wafer based on an offset of the second total thickness variation of the mass production wafer relative to a preset thickness variation.

In an embodiment, the determining unit is further configured to determine whether to perform the test using the test wafer based on a condition that the second total thickness variation of the mass production wafer is within a threshold range of a preset thickness variation.

In an embodiment, a supporting stage of the grinder is provided with a first fixed component, a second adjustable component and a third adjustable component. The grinding parameter includes displacement parameters of the second adjustable component and the third adjustable component.

In an embodiment, the grinding control device further includes a parameter determining unit. The parameter determining unit is configured to determine, based on experimental data that is acquired in advance, the updated grinding parameter by using the first total thickness variation of the grinded test wafer. The experimental data includes a correspondence between the first total thickness variation of the grinded test wafer that is acquired by the dedicated measurement device and the updated grinding parameter.

A grinding device is further provided according to an embodiment of the present disclosure. The grinding device includes a grinder and the above described grinding control device for a wafer.

A grinding control method and device for a wafer, and a grinding device are provided according to the embodiments of the present disclosure. A grinder may be controlled to grind a mass production wafer with a set grinding parameter. In a case that it is determined to perform a test using a test wafer, the grinder may be controlled to grind the test wafer with the set grinding parameter. A first total thickness variation of the grinded test wafer may be acquired by a dedicated measurement device, and an updated grinding parameter may be acquired based on the first total thickness variation. The set grinding parameter is updated to be the updated grinding parameter, and the grinder is controlled to grind the mass production wafer with the updated grinding parameter.

In the embodiments of the present disclosure, in a case that it is determined to perform the test using the test wafer, the updated grinding parameter may be acquired by performing the test using the test wafer. The updated grinding parameter is determined based on a thickness of the test wafer grinded with the set grinding parameter, thus the updated grinding parameter is related to the set grinding parameter. Further, the thickness of the test wafer is acquired by the dedicated measurement device, thus the thickness of the test wafer is accurate. The updated grinding parameter is further related to the thickness of the test wafer and may reflect flaws in the thickness of the test wafer, thus the updated grinding parameter is accurate. Therefore, the updated grinding parameter is related to the set grinding parameter and is accurate, and the set grinding parameter is updated to be the updated grinding parameter. The grinder is controlled to grind the mass production wafer with the updated grinding parameter, such that a wafer with an even thickness can be obtained, thereby improving the flatness of the grinded wafer.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described below. Apparently, the drawings in the following description show only some embodiments of the present disclosure, and other drawings may be obtained by those skilled in the art from the drawings without any creative work.

DETAILED DESCRIPTION OF EMBODIMENTS

In order to make the above objects, features and advantages become apparent, embodiments of the present disclosure are described below in detail with reference to the drawings.

Multiple details are described in the following descriptions, so as to fully understand the present disclosure. However, the present disclosure may be implemented by other ways different from the way described herein. Similar promotions can be made by those skilled in the art without departing from the spirit of the present disclosure. Therefore, the present disclosure is not limited to the specific embodiments described in the following.

The present disclosure is described in detail with reference to the schematic diagrams. For convenience of description, sectional views showing structures of devices may be partially enlarged not based on a general proportion. The schematic diagrams are merely exemplary, and the protection scope of the present disclosure is not limited hereto. Further, three-dimensional dimension including a length, a width and a depth should be included in practice.

As described in the background part, after device processing processes are performed on a front surface of a wafer, the wafer may be thinned at a back surface of the wafer, to facilitate other processes on the back surface of the wafer. For example, different wafers may be stacked and bonded together with a wafer-level packaging technology, and then a thinning process is performed at a back surface of each of the wafers to remove the wafer by a thickness of more than 90% of a total thickness of the wafer. In an exemplary application, a substrate with a thickness of 775 um may be thinned to have a thickness of 3 um.

In the conventional technology, a quick thinning process may be performed by a grinder. However, an error in flatness of the grinded wafer is large due to limitation of a conventional grinding device in operating mode and processing precision, failing to obtaining a surface with a required flatness. At present, an error in flatness of a wafer that is grinded by the grinder is about 2 um, failing to meet the requirement for flatness.

Based on the above technical problem, a grinding control method and device for a wafer, and a grinding device are provided according to the embodiments of the present disclosure. A grinder may be controlled to grind a mass production wafer with a set grinding parameter. In a case that it is determined to perform a test using a test wafer, the grinder may be controlled to grind the test wafer with the set grinding parameter. A first total thickness variation of the grinded test wafer may be acquired by a dedicated measurement device, and an updated grinding parameter may be acquired based on the first total thickness variation. The set grinding parameter is updated to be the updated grinding parameter, and the grinder is controlled to grind the mass production wafer with the updated grinding parameter.

In the embodiments of the present disclosure, the updated grinding parameter may be acquired by performing a test using a test wafer. The updated grinding parameter is determined based on a thickness of the test wafer grinded with the set grinding parameter, thus the updated grinding parameter is related to the set grinding parameter. Further, the thickness of the test wafer is acquired by the dedicated measurement device, thus the thickness of the test wafer is accurate. The updated grinding parameter is further related to the thickness of the test wafer and may reflect flaws in the thickness of the test wafer, thus the updated grinding parameter is accurate. Therefore, the updated grinding parameter is related to the set grinding parameter and is accurate, and the set grinding parameter is updated to be the updated grinding parameter. The grinder is controlled to grind the mass production wafer with the updated grinding parameter, such that a wafer with an even thickness can be obtained, thereby improving the flatness of the grinded wafer.

In order to make a better understanding of the technical solutions and the technical effects of the present disclosure, embodiments are described in detail below with reference to the drawings.

Figure 1:
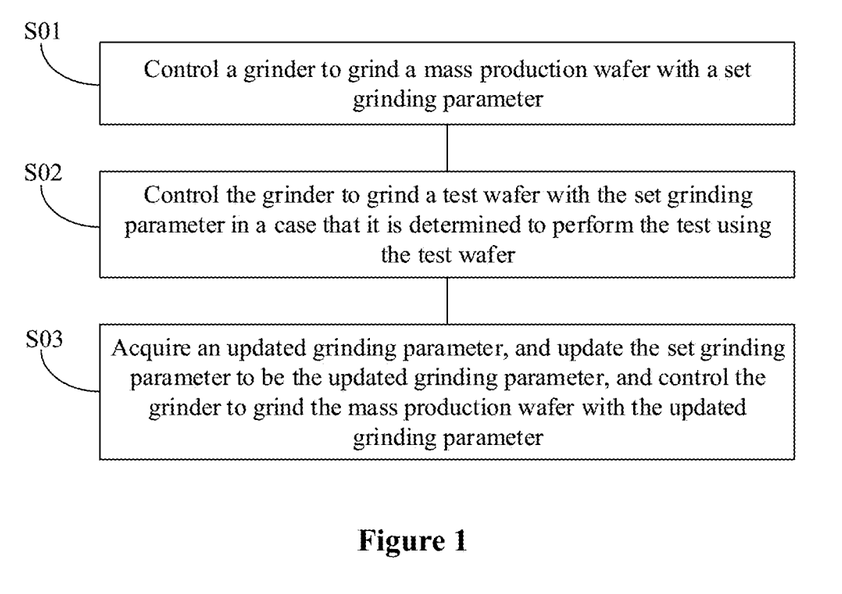
FIG. 1 is a schematic flowchart of a grinding control method for a wafer according to an embodiment of the present disclosure.

Reference is made to FIG. 1, which is a schematic flowchart of a grinding control method for a wafer according to an embodiment of the present disclosure. The grinding control method includes the following steps S01 to S03.

In step S01, a grinder is controlled to grind a mass production wafer with a set grinding parameter.

In an embodiment of the present disclosure, the grinder may grind a wafer under control. The wafer to be grinded may be a wafer stack formed by bonding multiple wafers together, or may be a single wafer required to be thinned by grinding.

Figure 2:
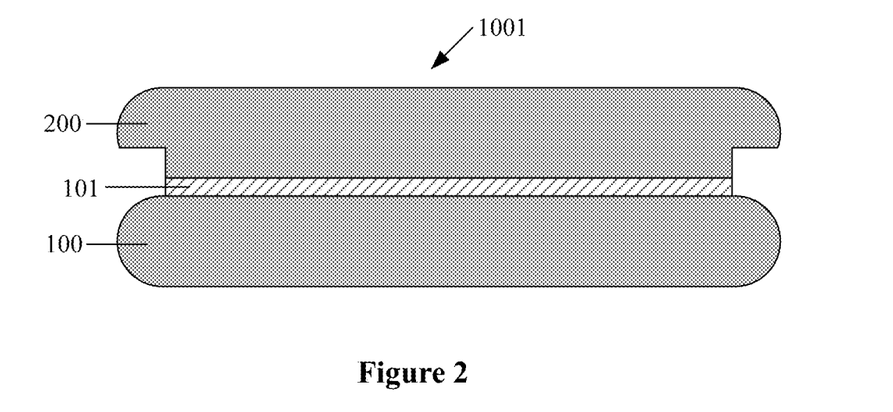
FIG. 2 is a schematic structural diagram of a wafer stack according to an embodiment of the present disclosure.

In the wafer stack, each of the multiple wafers may include a substrate, device structures formed on the substrate, and an interconnection layer for electrically connecting the device structures. The device structures may be covered by a dielectric layer. The interconnection layer is formed in the dielectric layer. As shown in FIG. 2, which is a schematic structural diagram of a wafer stack according to an embodiment of the present disclosure, a wafer stack 1001 includes a first wafer 100 and a second wafer 200. A front surface of the first wafer 100 is bonded to a front surface of the second wafer 200 via a bonding layer 101, to form the wafer stack 1001. An edge of the second wafer 200 is trimmed.

The substrate in each of the multiple wafers may be a semiconductor substrate, for example, a Si substrate, a Ge substrate, a SiGe substrate, a silicon on insulator (SOI) substrate, or a germanium on insulator (GOI) substrate. In other embodiments, the substrate may also a semiconductor substrate including other elements or compounds, such as GaAs, InP or SiC. The substrate may have a lamination structure, for example, a Si/SiGe structure. Alternatively, the substrate may also have another epitaxial structure, for example, a silicon and germanium on insulator (SGOI) structure.

The device structures may include a metal oxide semiconductor (MOS) device, a storage device, a sensor device and/or other passive devices. The storage device may include a nonvolatile memory, a random-access memory or the like. The nonvolatile memory may include a ferroelectric memory, a phase change memory, or a floating gate field-effect transistor such as an NOR flash memory, a NAND flash memory. The device structure may be a planar device or a three-dimensional device. The three-dimensional device may be, for example, a fin field-effect transistor (Fin-FET), a three-dimensional memory or the like. The interconnection layer may include a contact plug, a through hole, and a metal layer. The interconnection layer may include one or more layers. The interconnection layer may be made of a metal material, such as tungsten, aluminum, or copper.

Figure 3:
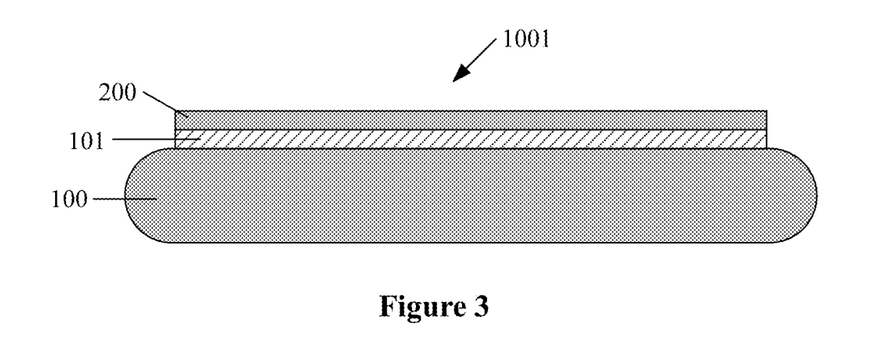
FIG. 3 is a schematic structural diagram of a thinned wafer stack according to an embodiment of the present disclosure.

The wafer stack may be grinded at a surface of a wafer on which no device structure is arranged. That is, the wafer is thinned at a back surface of the wafer. Reference is made to FIG. 3, which is a schematic structural diagram of a thinned wafer stack according to an embodiment of the present disclosure. The wafer stack 1001 is thinned at a back surface of the second wafer 200. Generally, the grinding is suitable for mass production of wafers. Therefore, in the embodiments of the present disclosure, a wafer required to be thinned is referred to as a mass production wafer, and a wafer to be grinded for testing grinding characteristics of the grinder is referred to as a test wafer.

Figure 4:
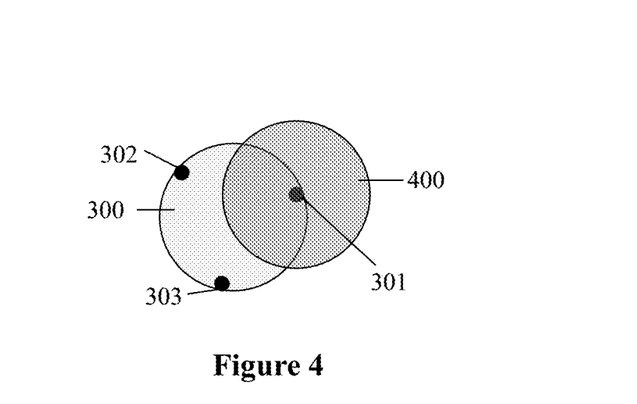
FIG. 4 is a schematic top view of a grinder according to an embodiment of the present disclosure.
Figure 5:
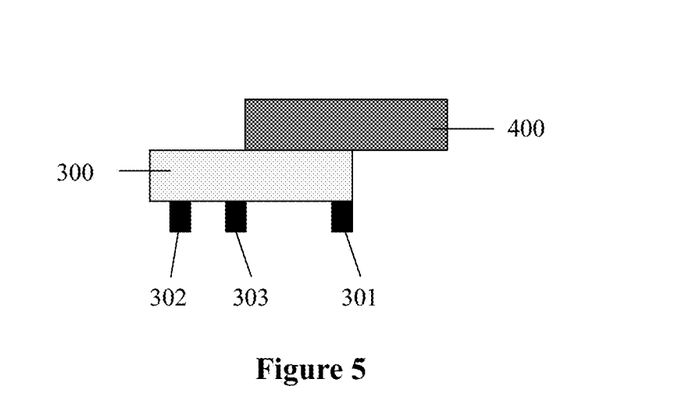
FIG. 5 is a schematic front view of a grinder according to an embodiment of the present disclosure.

Reference is made to FIGS. 4 and 5, FIG. 4 is a schematic top view of a grinder according to an embodiment of the present disclosure, and FIG. 5 is a schematic front view of a grinder according to an embodiment of the present disclosure. The grinder may include a supporting stage 300 and a grinding head 400. The wafer may be arranged on the supporting stage 300, for being thinned. A surface of the wafer to be grinded may be arranged upwardly, and the grinding head 400 touches and rubs the upper surface of the wafer under control, such that a structure of the wafer at the upper surface is destroyed, to remove the wafer by a certain thickness, thereby thinning the wafer.

Specifically, the supporting stage 300 may be provided with a first fixed component 301, a second elevating component 302 and a third elevating component 303. The first fixed component 301 has a fixed position. The second elevating component 302 and the third elevating component 303 may have adjustable positions. Height of the supporting stage at a local region may be adjusted by adjusting heights of the second elevating component 302 and the third elevating component 303. In practice, the height of the second elevating component 302 may be adjusted by controlling a motor D, and the height of the third elevating component 303 may be adjusted by controlling a motor S.

In some embodiments, the grinder may be provided with a thickness measurement device. In a case that the mass production wafer is grinded, a thickness of the grinded mass production wafer may be measured by the thickness measurement device, to acquire a second total thickness variation (TTV) of the grinded mass production wafer. The second TTV may include a difference between a maximum value and a minimum value of a thickness of the wafer, and a large difference corresponds to a poor flatness of the wafer. The second TTV may also include information of thicknesses of the wafer at different positions, which may reflect topography of the grinded mass production wafer at the different positions. The grinder may adjust the grinding parameter based on the second TTV acquired by the thickness measurement device, such that the grinded wafer meet certain requirements.

In an embodiment of the present disclosure, the grinding parameter may include displacement parameters of the second elevating component 302 and the third elevating component 303. The height of the supporting stage 300 at a local region may be adjusted by adjusting the displacement parameters of the second elevating component 302 and the third elevating component 303, to adjust a position of the grinding head 400 relative to different regions on the upper surface of the wafer on the supporting stage 300, so as to adjust a speed at which grinding is performed at the upper surface of the wafer. The displacement parameters of the second elevating component 302 and the third elevating component 303 may be position parameters of the second elevating component 302 and the third elevating component 303 relative to the first fixed component 301.

Figure 6A:
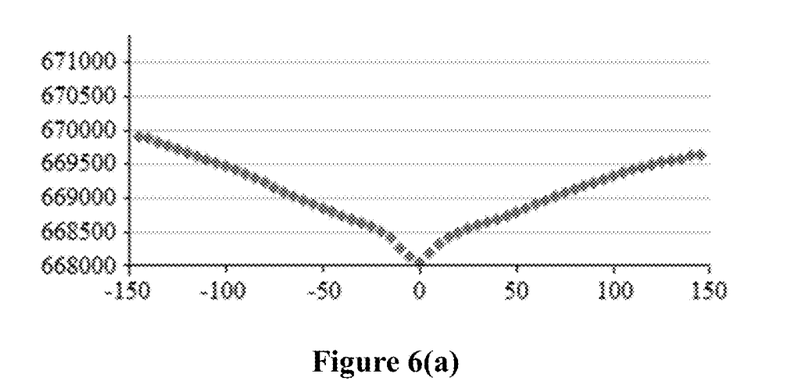
FIGS. 6(a) to 6(d) are schematic diagrams respectively showing total thickness variations (TTV) of a wafer corresponding to different displacement parameters of a second elevating component according to an embodiment of the present disclosure.
Figure 6B:
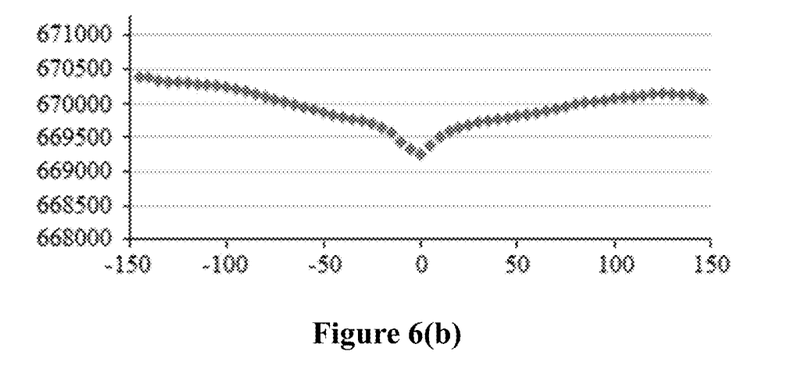
Figure 6C:
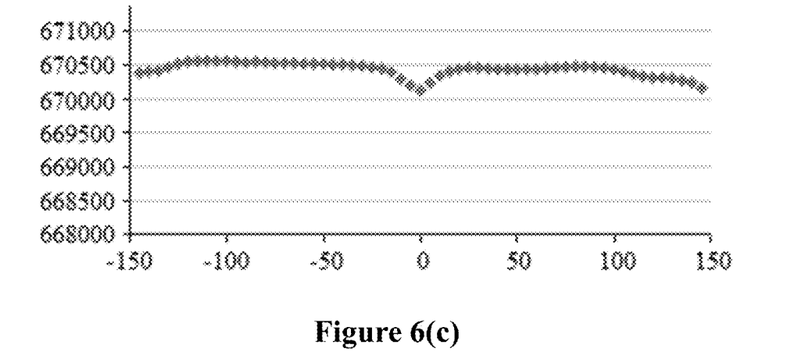
Figure 6D:
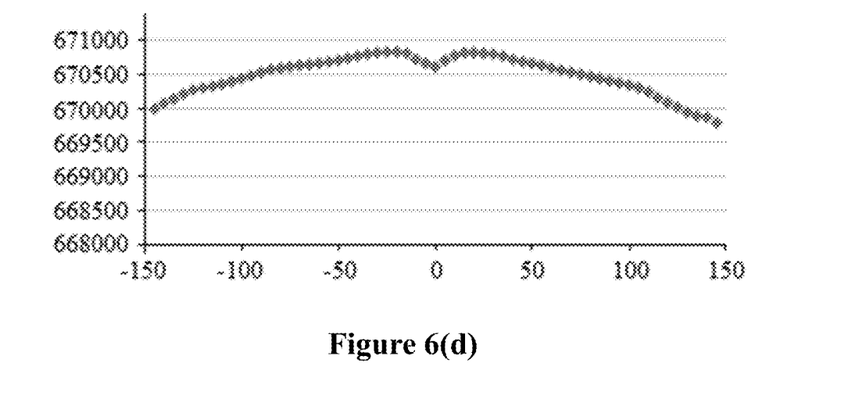

Specifically, a difference between heights at an edge and a center of the wafer may be adjusted by adjusting the height of the second elevating component 302. That is, a "V"-shape topography of the wafer is adjusted. Reference is made to FIGS. 6(a) to 6(d), which are schematic diagrams respectively showing TTVs of a wafer corresponding to different displacement parameters of the second elevating component 302 in a case that heights of the third elevating component 303 and the first fixed component 301 are fixed. FIG. 6(a) is a schematic diagram showing the TTV of the wafer in a case that the second elevating component 302 is arranged at an initial position. FIGS. 6(b), 6(c), and 6(d) are schematic diagrams showing the TTVs of the wafer respectively in cases that the second elevating component is descended by one unit, two units, and three units. As shown in FIGS. 6(a) to 6(d), with the descending of the second elevating component 302, a thickness at the center of the wafer is increased relative to a thickness at the edge of the wafer. It is shown from many tests that there is a good linearity and repeatability between a displacement of the second elevating component 302 and a variation of the "V"-shape topography of the wafer.

Figure 7A:
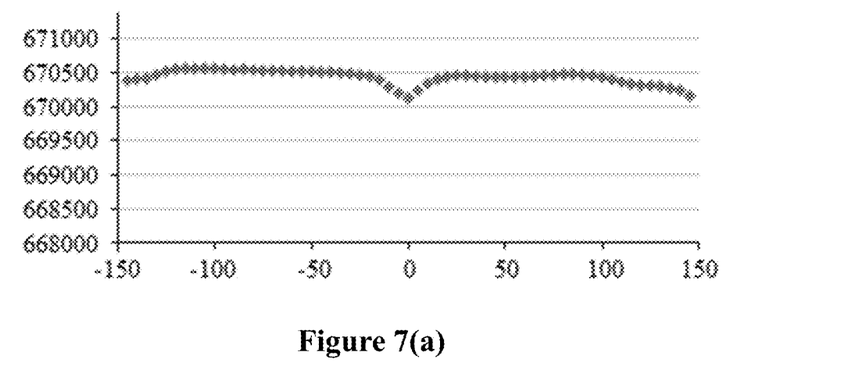
FIGS. 7(a) to 7(d) are schematic diagrams respectively showing TTVs of a wafer corresponding to different displacement parameters of a third elevating component according to an embodiment of the present disclosure.
Figure 7B:
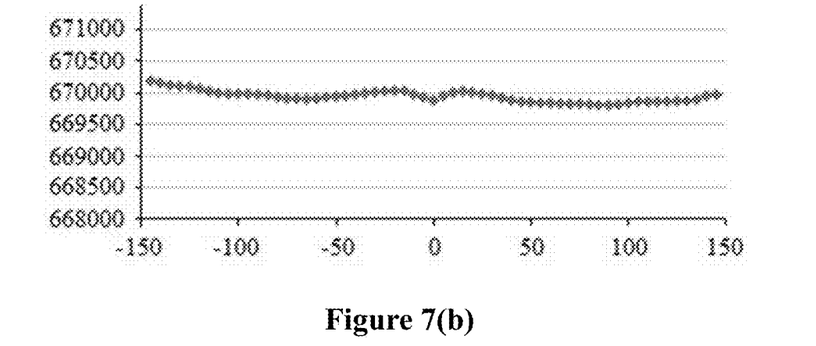
Figure 7C:
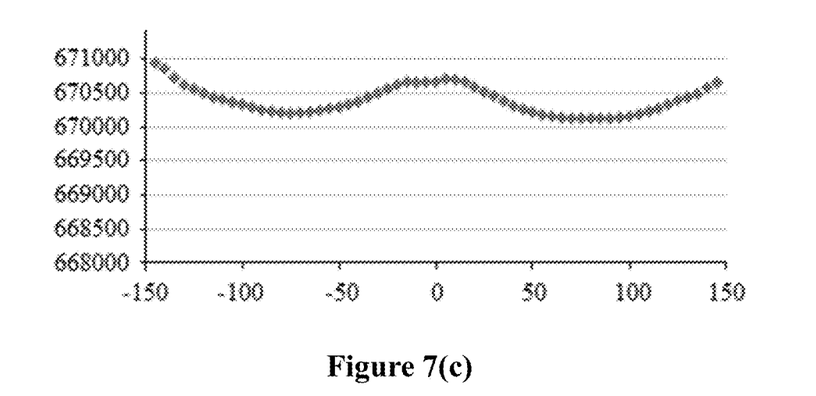
Figure 7D:
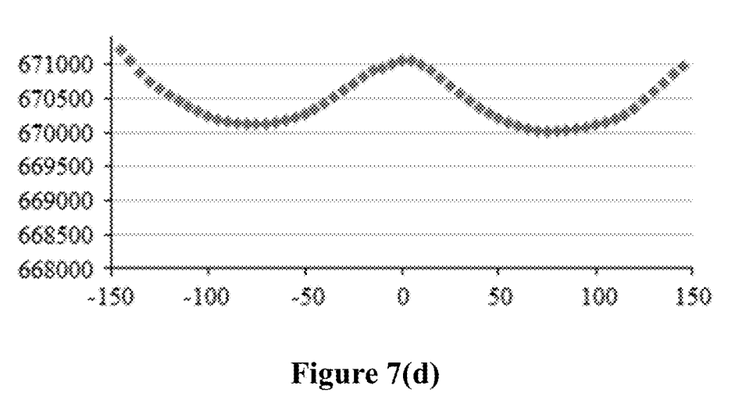

Specifically, a height at a region between the edge and the center of the wafer may be adjusted by adjusting the height of the third elevating component 303. That is, a "M"-shape topography of the wafer is adjusted. Reference is made to FIGS. 7(a) to 7(d), which are schematic diagrams respectively showing TTVs of a wafer corresponding to different displacement parameters of the third elevating component 303 in a case that heights of the second elevating component 302 and the first fixed component 301 are fixed. FIG. 7(a) is a schematic diagram showing the TTV of the wafer in a case that the third elevating component 303 is arranged at an initial position. FIGS. 7(b), 7(c), and 7(d) are schematic diagrams showing the TTVs of the wafer respectively in cases that the third elevating component 303 is ascended by one unit, two units, and three units. As shown in FIGS. 7(a) to 7(d), with the ascending of the third elevating component 303, a thickness of the region between the edge and the center of the wafer is gradually reduced. It is shown from many tests that there is a good linearity and repeatability between a displacement of the third elevating component 303 and a variation of the "M"-shape topography of the wafer.

In an embodiment of the present disclosure, the set grinding parameter may be a preferable grinding parameter acquired in advance based on experiments. For example, the grinder may adjust the grinding parameter based on the second TTV. Alternatively, an initial grinding parameter may be set manually. Then, the grinder is controlled to grind the mass production wafer with the set grinding parameter. The set grinding parameter may include set displacement parameters of the second elevating component 302 and the third elevating component 303. For example, a difference between heights of the second elevating component 302 and the first fixed component 301 is indicated by $h_1$, and a difference between heights of the third elevating component 303 and the first fixed component 301 is indicated by $h_2$.

In step S02, the grinder is controlled to grind a test wafer with the set grinding parameter in a case that it is determined to perform a test using the test wafer.

In an embodiment of the present disclosure, during a process of grinding the mass production wafer, it may be determined whether to perform the test using the test wafer, such that the set grinding parameter is adjusted based on a test result. If it is determined not to perform the test using the test wafer, no test is performed using the test wafer, and the mass production wafer is grinded with the set grinding parameter continually. If it is determined to perform the test using the test wafer, the grinder is controlled to grind the test wafer with the set grinding parameter.

Since the determination on whether to perform the test using the test wafer is actually performed by determining whether to adjust the grinding parameter, the determination may be performed based on the number and flatness parameters of the mass production wafers that are grinded. This is because an offset may be caused in the set grinding parameter after a large number of mass production wafers are grinded, which requires to adjust the set grinding parameter, and the grinding parameter is also required to be adjusted if the flatness parameter of the grinded mass production wafer does not meet the requirement.

Specifically, it may be determined whether the number of the mass production wafers reaches a mass production cycle. If it is determined that the number of the mass production wafers reaches the mass production cycle, it is determined to perform the test using the test wafer. The mass production cycle indicates a cycle at which the grinding parameter is adjusted, and may be expressed by the number of mass production wafers that are grinded. For example, in a case that the mass production cycle is set to be 500, every 500 mass production wafers are grinded, the grinding parameter is adjusted once. In this case, it is required to perform a test using the test wafer.

Specifically, it may be determined whether to perform a test using the test wafer based on the second TTV of the grinded mass production wafer acquired by the thickness measurement device. If the second TTV of the mass production wafer does not meet the requirement, it is determined to perform the test using the test wafer, to adjust the grinding parameter.

In practice, it may be determined whether to perform a test using the test wafer based on an offset between the second TTV of the mass production wafer and a preset thickness deviation. In a case of a large offset, which indicates that the flatness of the mass production wafer is poor, the test may be performed using the test wafer. In practice, it may be determined whether to perform the test using the test wafer based on a condition that the second TTV of the mass production wafer is within a threshold range of a preset thickness variation. In a case that the second TTV of the mass production wafer is not within the range of the threshold range of the preset thickness variation, which indicates that the flatness of the mass production wafer is poor, the test may be performed using the test wafer.

If it is determined to perform the test using the test wafer, which indicates that the set grinding parameter is required to be adjusted, the grinder may be controlled to grind the test wafer with the set grinding parameter, to obtain a grinded test wafer. Theoretically, flatness of the test wafer grinded with the set grinding parameter is substantially the same as the flatness of the mass production wafer grinded with the set grinding parameter, thus the grinder may be tested based on the grinded test wafer.

In step S03, an updated grinding parameter is acquired, and the set grinding parameter is updated to be the updated grinding parameter, the grinding control method returns back to step S01.

Figure 8:
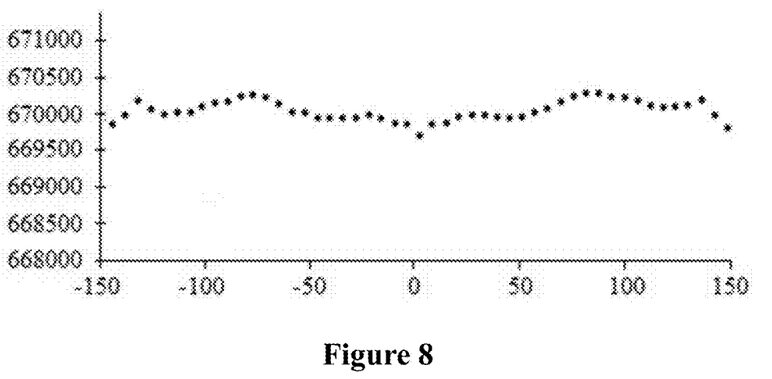
FIG. 8 is a schematic diagram showing a first TTV according to an embodiment of the present disclosure.

In a case that the test wafer is grinded with the set grinding parameter, a first TTV of the test wafer may be acquired by a dedicated measurement device. The first TTV may include information of thicknesses of the wafer at different positions, which may reflect morphology of the grinded test wafer at different positions. Reference is made to FIG. 8, which is a schematic diagram showing a first TTV according to an embodiment of the present disclosure. In FIG. 8, a horizontal axis shows the different positions of the mass production wafer with a unit of millimeter (mm), and a vertical axis shows the thickness of the mass production wafer with a unit of nanometer (nm). As shown in FIG. 8, an error of the flatness of the test wafer is about 2 um, that is, the flatness is poor. Since the first TTV of the test wafer is acquired by controlling the grinder to grind the test wafer with the set grinding parameter, it may be inferred that a flaw similar to that in a surface of the test wafer also exists in the surface of the mass production wafer grinded with the set grinding parameter, that is, the flatness of the mass production wafer grinded with the set grinding parameter is also poor. It should be noted that, compared with the thickness measurement device, the dedicated measurement device has a higher measurement accuracy, thus the first TTV is more accurate than the second TTV.

The updated grinding parameter is determined by using the first TTV of the test wafer based on experimental data acquired in advance. The experimental data includes a correspondence between the first TTV of the grinded test wafer that is acquired by the dedicated measurement device and the grinding parameter. In this way, a grinding parameter corresponding to the first TTV of the test wafer may be determined based on the first TTV of the test wafer and is used as the updated grinding parameter.

The experimental data may be acquired in advance through experiments. Specifically, the grinder may be controlled to grind the test wafer with a first grinding parameter, and the grinded test wafer has a first history TTV. A second grinding parameter may be determined based on the first history TTV according to influence of the grinding parameter on thicknesses of a grinded wafer at different positions. With the second grinding parameter, factors resulting in non-flatness in the test wafer may be eliminated. The grinder is controlled to grind the test wafer with the second grinding parameter, and the grinded test wafer has a second history TTV. Compared with the test wafer having the first history TTV, the test wafer having the second history TTV has a better flatness. Therefore, a correspondence between the second history TTV and the second grinding parameter may be used as the experimental data.

In a case that the first TTV is equal to the second history TTV, the second grinding parameter may be used as the updated grinding parameter. Since the pre-acquired correspondence between a TTV representing a good flatness and the grinding parameter is used as the experimental data, and the wafer grinded with the grinding parameter corresponding to the TTV representing a good flatness, the grinded wafer has a good flatness.

In practice, the difference between heights at the edge and the center of the wafer may be adjusted by adjusting the height of the second elevating component 302, and the height at a region between the edge and the center of the wafer may be adjusted by adjusting the height of the third elevating component 303. In this way, the displacement parameters of the second elevating component 302 and the third elevating component 303 may be determined based on a height at the edge of the wafer, a height at the center of the wafer and the height at the region between the edge and the center of the wafer in the first history TTV, thereby eliminating factors resulting in non-flatness of the wafer. For example, for the first TTV shown in FIG. 8, the third elevating component 303 may be ascended with the displacement parameter of the third elevating component 303 that is determined based on the correspondence obtained through the experiments, thereby accurately reducing a thickness at the region between the edge and the center of the wafer, thus improving the flatness of the test wafer.

The updated grinding parameter may be determined based on the first TTV of the grinded test wafer. The updated grinding parameter may be determined for a flaw in the thickness in the first TTV. Further, the first TTV is acquired by the dedicated measurement device and has a high measurement accuracy, thus the updated grinding parameter determined based on the first TTV is also accurate. Further, since the first TTV reflects information of the thickness of the grinded test wafer and the test wafer is grinded with the set grinding parameter, the first TTV is related to the set grinding parameter, such that the updated grinding parameter is determined based on the first TTV for the set grinding parameter, thereby overcoming a deficiency of the set grinding parameter in an actual process of grinding.

That is, the updated grinding parameter is determined for the set grinding parameter and is more accurate. The mass production wafer grinded by the grinder with the updated grinding parameter has a flatter grinding surface. Therefore, the updated grinding parameter is used as the set grinding parameter, and the grinding control method returns back to step S01. That is, the grinder is controlled to grind the mass production wafer with the updated grinding parameter. In a case that it is determined to perform a test using the test wafer for a next time, the set grinding parameter may be adjusted again.

It is found through studies that, in a case that the set grinding parameter is determined based on the second TTV and the grinder is controlled to grind the mass production wafer with the set grinding parameter, or in a case that a large number of the mass production wafers are grinded, for example, in a case that the number of the mass production wafers exceeds the mass production cycle, an error in the flatness of the grinded mass production wafer may be up to about 2 um. For a substrate with a small thickness, a large error in the flatness indicates that the substrate is thin at a local region, where there is a risk that the substrate is worn out, thus decreasing reliability of a device.

Figure 9:
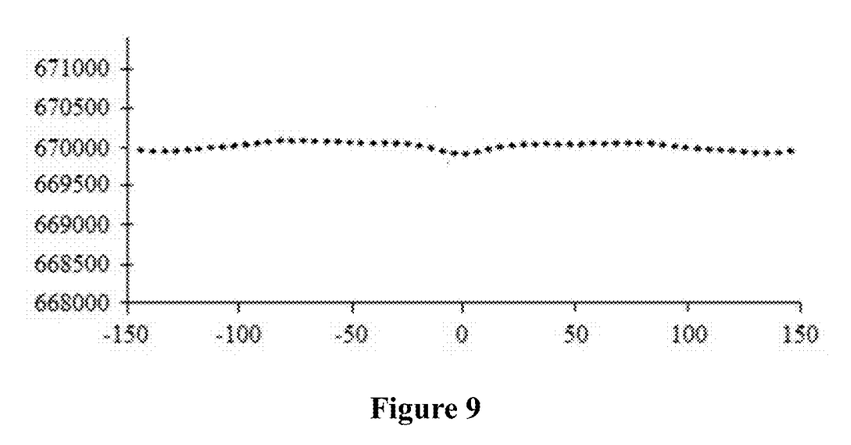
FIG. 9 is a schematic diagram showing a third TTV according to an embodiment of the present disclosure.

However, with the grinding control method for a wafer according to the embodiment of the present disclosure, the mass production wafer is grinded by using the updated grinding parameter as the set grinding parameter, the error in the flatness of the grinded mass production wafer can be less than 0.5 um. Reference is made to FIG. 9, which is a schematic diagram showing a third TTV of the mass production wafer that is grinded with the updated grinding parameter according to an embodiment of the present disclosure. In FIG. 9, a horizontal axis shows the different positions on the mass production wafer with a unit of mm, and a vertical axis shows the thickness of the mass production wafer with a unit of nm. It can be seen that, with the grinding control method for a wafer according to the embodiment of the present disclosure, a mass production wafer having a good flatness can be obtained.

In the embodiments of the present disclosure, in a case that it is determined to perform a test using the test wafer, the updated grinding parameter may be acquired by performing the test using the test wafer. The updated grinding parameter is determined based on a thickness of the test wafer grinded with the set grinding parameter, thus the updated grinding parameter is related to the set grinding parameter. Further, the thickness of the test wafer is acquired by the dedicated measurement device, thus the thickness of the test wafer is accurate. The updated grinding parameter is further related to the thickness of the test wafer and may reflect flaws in the thickness of the test wafer, thus the updated grinding parameter is accurate. Therefore, the updated grinding parameter is related to the set grinding parameter and is accurate, and the set grinding parameter is updated to be the updated grinding parameter. The grinder is controlled to grind the mass production wafer with the updated grinding parameter, such that a wafer with an even thickness can be obtained, thereby improving the flatness of the grinded wafer.

Figure 10:
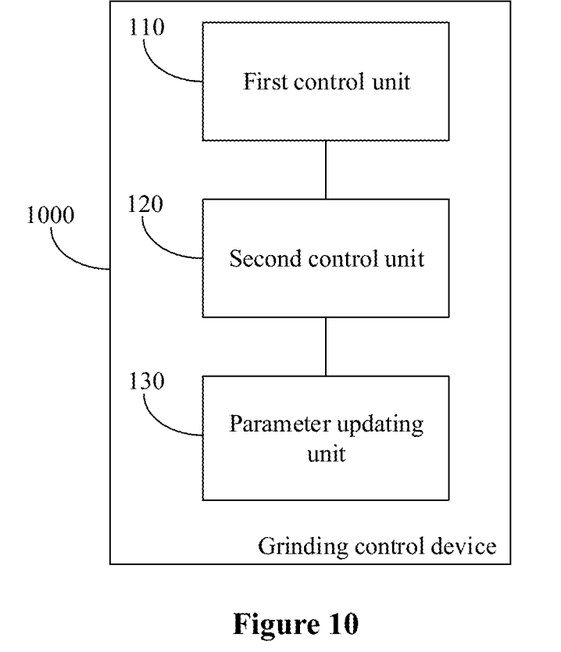
FIG. 10 is a schematic structural diagram of a grinding control device for a wafer according to an embodiment of the present disclosure.

Based on the grinding control method for a wafer according to the above embodiments of the present disclosure, reference is made to FIG. 10, which is a schematic structural diagram of a grinding control device 1000 for a wafer according to an embodiment of the present disclosure. The grinding control device may include a first control unit 110, a second control unit 120 and a parameter updating unit 130. The first control unit 110 is configured to control a grinder to grind a mass production wafer with a set grinding parameter. The second control unit 120 is configured to control the grinder to grind a test wafer with the set grinding parameter in a case that it is determined to perform the test using the test wafer. The parameter updating unit 130 is configured to acquire an updated grinding parameter, and update the set grinding parameter to be the updated grinding parameter. The updated grinding parameter is determined based on a first total thickness variation of the grinded test wafer, and the first total thickness variation of the grinded test wafer is acquired by a dedicated measurement device.

In an embodiment, the grinding control device further includes a determining unit. The determining unit is configured to determine whether the number of the mass production wafer reaches a mass production cycle, and determine to perform the test using the test wafer in a case that the number of the mass production wafer reaches the mass production cycle.

In an embodiment, the grinder is provided with a thickness measurement device. The grinding control device further includes a thickness information acquiring unit and a determining unit. The thickness information acquiring unit is configured to acquire a second total thickness variation of the grinded mass production wafer by the thickness measurement device. The determining unit is configured to determine whether to perform the test using the test wafer based on the second total thickness variation of the mass production wafer.

In an embodiment, the determining unit is further configured to determine whether to perform the test using the test wafer based on an offset of the second total thickness variation of the mass production wafer relative to a preset thickness variation.

In an embodiment, the determining unit is further configured to determine whether to perform the test using the test wafer based on a condition that the second total thickness variation of the mass production wafer is within a threshold range of a preset thickness variation.

In an embodiment, a supporting stage of the grinder is provided with a first fixed component, a second elevating component and a third elevating component. The grinding parameter includes displacement parameters of the second elevating component and the third elevating component.

In an embodiment, the grinding control device further includes a parameter determining unit. The parameter determining unit is configured to determine, based on experimental data that is acquired in advance, the updated grinding parameter by using the first total thickness variation of the grinded test wafer. The experimental data includes a correspondence between the first total thickness variation of the grinded test wafer that is acquired by the dedicated measurement device and the grinding parameter.

In the embodiments of the present disclosure, in a case that it is determined to perform the test using the test wafer, the updated grinding parameter may be acquired by performing the test using the test wafer. The updated grinding parameter is determined based on a thickness of the test wafer grinded with the set grinding parameter, thus the updated grinding parameter is related to the set grinding parameter. Further, the thickness of the test wafer is acquired by the dedicated measurement device, thus the thickness of the test wafer is accurate. The updated grinding parameter is further related to the thickness of the test wafer and may reflect flaws in the thickness of the test wafer, thus the updated grinding parameter is accurate. Therefore, the updated grinding parameter is related to the set grinding parameter and is accurate, and the set grinding parameter is updated to be the updated grinding parameter. The grinder is controlled to grind the mass production wafer with the updated grinding parameter, such that a wafer with an even thickness can be obtained, thereby improving the flatness of the grinded wafer.

Figure 11:
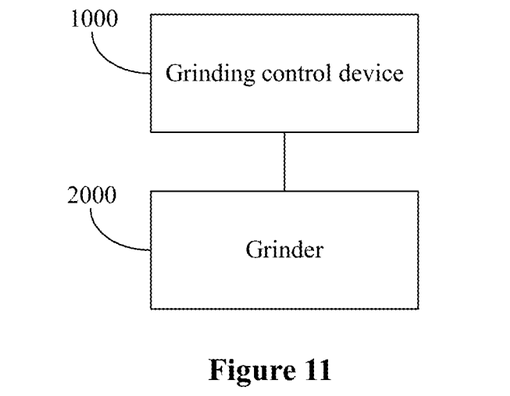
FIG. 11 is a schematic structural diagram of a grinding device according to an embodiment of the present disclosure.

Based on the above grinding control method and device for a wafer according to the embodiments of the present disclosure, a grinding device is further provided according to an embodiment of the present disclosure. Reference is made to FIG. 11, which is a schematic structural diagram of a grinding device according to an embodiment of the present disclosure. The grinding device includes a grinder 2000 and a grinding control device 1000. As shown in FIG. 10, the grinding control device 1000 may perform the above grinding control method for a wafer.

The embodiments in this specification are described in a progressive way, each of which emphasizes the differences from others, and the same or similar parts among the embodiments can be referred to each other. Since the device disclosed in the embodiments corresponds to the method therein, the description thereof is relatively simple, and for relevant parts references may be made to the description of the method.

The above are only preferred embodiments of the present disclosure. Although the present disclosure has been disclosed in the above with the preferred embodiments, the present disclosure is not limited thereto. Numerous alternations, modifications, and equivalents can be made to the technical solution of the present disclosure by those skilled in the art according to the methods and technical content disclosed herein without deviation from the scope of the technical solution of the present disclosure. Therefore, the alternations, modifications, and equivalents made to the technical solution of the present disclosure according to the technical essences of the present disclosure without departing from the technical solutions of the present disclosure should fall within the protection scope of the present disclosure.

The invention claimed is:

1. A method for controlling grinding on a wafer, comprising:
   controlling a grinder to grind a mass production wafer with a set grinding parameter;
   determining whether to perform a test using a test wafer;
   controlling, in response to determining to perform the test using the test wafer, the grinder to grind the test wafer with the set grinding parameter; and
   updating the set grinding parameter to be a new grinding parameter, and controlling the grinder to grind the mass production wafer with the new grinding parameter, wherein the new grinding parameter is determined based on a first total thickness variation of the grinded test wafer, and the first total thickness variation is acquired by a dedicated measurement device.

2. The method according to claim 1, wherein the determining whether to perform the test using the test wafer comprises:
   determining whether a number of the mass production wafers that have been grinded reaches a total quantity of a mass production cycle; and
   determining to perform the test using the test wafer in response to the number of the mass production wafers that have been grinded reaching the total quantity of the mass production cycle.

3. The method according to claim 1, wherein
   the grinder is provided with a thickness measurement device, and after the controlling the grinder to grind the mass production wafer with the set grinding parameter, the method further comprises:
      acquiring, by the thickness measurement device, a second total thickness variation of the grinded mass production wafer, and wherein
   the determining whether to perform the test using the test wafer comprises:
      determining, based on the second total thickness variation of the grinded mass production wafer, whether to perform the test using the test wafer.

4. The method according to claim 3, wherein the determining, based on the second total thickness variation of the grinded mass production wafer, whether to perform the test using the test wafer comprises:
   determining whether to perform the test using the test wafer based on an offset of the second total thickness variation of the grinded mass production wafer relative to a preset thickness variation.

5. The method according to claim 3, wherein the determining, based on the second total thickness variation of the grinded mass production wafer, whether to perform the test using the test wafer comprises:
   determining whether to perform the test using the test wafer based on a condition that the second total thickness variation of the grinded mass production wafer is within a threshold range of a preset thickness variation.

6. The method according to claim 1, wherein
   a supporting stage of the grinder is provided with a first fixed component, a second elevating component and a third elevating component, and
   the new grinding parameter comprises a displacement parameter of the second elevating component and a displacement parameter of the third elevating component.

7. The method according to claim 1, wherein updating the grinding parameter to be the new grinding parameter comprises:
   determining, based on experimental data that is acquired in advance, the new grinding parameter by using the first total thickness variation of the grinded test wafer, wherein the experimental data comprises a correspondence between the first total thickness variation of the grinded test wafer that is acquired by the dedicated measurement device and the new grinding parameter.

8. An apparatus for controlling grinding on a wafer, comprising:
   a processor; and
   a memory, storing computer-readable instructions;
   wherein the computer-readable instructions when executed by the processor configure an electronic device to perform:
   controlling a grinder to grind a mass production wafer with a set grinding parameter;
   determining whether to perform a test using a test wafer;
   controlling, in response to determining to perform the test using the test wafer, the grinder to grind the test wafer with the set grinding parameter; and
   updating the set grinding parameter to be a new grinding parameter, and controlling the grinder to grind the mass production wafer with the new grinding parameter, wherein the new grinding parameter is determined based on a first total thickness variation of the grinded test wafer, and the first total thickness variation is acquired by a dedicated measurement device.

9. The apparatus according to claim 8, wherein the determining whether to perform the test using the test wafer comprises:
   determining whether a number of the mass production wafers that have been grinded reaches a total quantity of a mass production cycle; and
   determining to perform the test using the test wafer in response to the number of the mass production wafers that have been grinded reaching the total quantity of the mass production cycle.

10. The apparatus according to claim 8, wherein
   the grinder is provided with a thickness measurement device, and after the controlling the grinder to grind the mass production wafer with the set grinding parameter, the method further comprises:

acquiring, by the thickness measurement device, a second total thickness variation of the grinded mass production wafer, and wherein the determining whether to perform the test using the test wafer comprises:

determining, based on the second total thickness variation of the grinded mass production wafer, whether to perform the test using the test wafer.

11. The apparatus according to claim 10, wherein the determining, based on the second total thickness variation of the grinded mass production wafer, whether to perform the test using the test wafer comprises:

determining whether to perform the test using the test wafer based on an offset of the second total thickness variation of the grinded mass production wafer relative to a preset thickness variation.

12. The apparatus according to claim 10, wherein the determining, based on the second total thickness variation of the grinded mass production wafer, whether to perform the test using the test wafer comprises:

determining whether to perform the test using the test wafer based on a condition that the second total thickness variation of the grinded mass production wafer is within a threshold range of a preset thickness variation.

13. The apparatus according to claim 8, wherein a supporting stage of the grinder is provided with a first fixed component, a second elevating component and a third elevating component, and the new grinding parameter comprises a displacement parameter of the second elevating component and a displacement parameter of the third elevating component.

14. The apparatus according to claim 8, wherein updating the grinding parameter to be the new grinding parameter comprises:

determining, based on experimental data that is acquired in advance, the new grinding parameter by using the first total thickness variation of the grinded test wafer, wherein the experimental data comprises a correspondence between the first total thickness variation of the grinded test wafer that is acquired by the dedicated measurement device and the new grinding parameter.

15. A device for grinding a wafer, comprising:

the apparatus according to claim 8, and the grinder.

16. The method according to claim 6, wherein controlling the grinder to grind the mass production wafer with the new grinding parameter comprises:

adjusting a height of the second elevating component while not adjusting a height of the third elevating component when the first total thickness variation indicates that a difference between heights at an edge and a center of the grinded test wafer needs to be adjusted; and adjusting the height of the third elevating component while not adjusting the height of the second elevating component when the first total thickness variation indicates that a height at a region between the edge and the center of the grinded test wafer needs to be adjusted.

17. The apparatus according to claim 13, wherein controlling the grinder to grind the mass production wafer with the new grinding parameter comprises:

adjusting a height of the second elevating component while not adjusting a height of the third elevating component when the first total thickness variation indicates that a difference between heights at an edge and a center of the grinded test wafer needs to be adjusted; and adjusting the height of the third elevating component while not adjusting the height of the second elevating component when the first total thickness variation indicates that a height at a region between the edge and the center of the grinded test wafer needs to be adjusted.

* * * * *